United States Patent
Kwon

(10) Patent No.: US 9,465,544 B2
(45) Date of Patent: Oct. 11, 2016

(54) METHOD OF PROCESSING DATA AND SYSTEM USING THE SAME

(75) Inventor: Moon Sang Kwon, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 8 days.

(21) Appl. No.: 13/307,410

(22) Filed: Nov. 30, 2011

(65) Prior Publication Data

US 2012/0144113 A1    Jun. 7, 2012

Related U.S. Application Data

(60) Provisional application No. 61/419,273, filed on Dec. 3, 2010.

(51) Int. Cl.
*G06F 3/06* (2006.01)
*G11C 16/26* (2006.01)

(52) U.S. Cl.
CPC ........... *G06F 3/0611* (2013.01); *G06F 3/0659* (2013.01); *G06F 3/0679* (2013.01); *G11C 16/26* (2013.01)

(58) Field of Classification Search
CPC ........ G06F 12/00; G06F 12/02; G06F 12/08; G06F 13/28
See application file for complete search history.

(56) References Cited

U.S. PATENT DOCUMENTS

| | | | |
|---|---|---|---|
| 7,694,071 B1 * | 4/2010 | Sidhu et al. | 711/112 |
| 2005/0005059 A1 * | 1/2005 | Tanaka et al. | 711/103 |
| 2006/0005059 A1 * | 1/2006 | Uzelac et al. | 713/323 |
| 2007/0061538 A1 * | 3/2007 | Chang et al. | 711/169 |
| 2008/0162479 A1 * | 7/2008 | Ju | 707/7 |
| 2009/0013125 A1 * | 1/2009 | Mizushima et al. | 711/103 |
| 2009/0150600 A1 * | 6/2009 | Suda | 711/103 |
| 2009/0235017 A1 * | 9/2009 | Estakhri et al. | 711/103 |
| 2010/0287353 A1 * | 11/2010 | Khmelnitsky et al. | 711/170 |
| 2011/0019475 A1 * | 1/2011 | Moshayedi | 365/185.11 |
| 2011/0022781 A1 * | 1/2011 | Wakrat et al. | 711/103 |
| 2011/0078387 A1 * | 3/2011 | Chiras et al. | 711/154 |
| 2012/0084484 A1 * | 4/2012 | Post et al. | 710/308 |
| 2012/0239853 A1 * | 9/2012 | Moshayedi | 711/103 |

FOREIGN PATENT DOCUMENTS

JP      EP0687984 A1 * 12/1995 ........... G06F 13/42

* cited by examiner

*Primary Examiner* — Charles Rones
*Assistant Examiner* — Han Doan
(74) *Attorney, Agent, or Firm* — Volentine & Whitt, PLLC

(57) ABSTRACT

A host generates an address array including a header and each start address to perform a data processing operation, which may for example be 4 Kbytes of a random read operation or a random write operation, and transmits a generated address array to a data storage device through a data bus. The data storage device, in the case of a random read operation, outputs each data corresponding to the each start address to the host successively by using the address array. In the case of a random write operation, the data storage device receives each data corresponding to each start address from the host and stores it in a memory core.

19 Claims, 9 Drawing Sheets

//www.jedec.org). A data processing system including the eMMC™
METHOD OF PROCESSING DATA AND SYSTEM USING THE SAME

CROSS-REFERENCE TO RELATED APPLICATIONS

A claim of priority under 35 U.S.C. §119 has been made to U.S. Provisional Patent Application No. 61/419,273 filed on Dec. 3, 2010, the entirety of which are hereby incorporated by reference.

BACKGROUND

The inventive concepts described herein relate to a data processing technology, and more particularly, to a method of processing data according to an address array defined newly in a embedded multi Media card (eMMC) or a secure digital (SD) card system, and a system performing the method.

A multi media card (eMMC™) is card interface (I/F) standard determined as a standard in JEDEC (http://www.jedec.org). A data processing system including the eMMC™ needs to process data during a short period of time.

SUMMARY

The inventive concepts provide a method of processing data according to an address array newly defined and used in an embedded Multi Media card eMMC™ or a secure digital SD card system to improve a data processing speed, e.g., a random read speed or a random write speed, and a system performing the method.

In an embodiment of the inventive concepts, a data processing method of a memory card includes receiving an address array which is output from a host and includes a plurality of start addresses respectively indicating start locations of a plurality of data storage regions; and transmitting data read from each of the plurality of data storage regions related to each of the plurality of start addresses to the host.

The address array may include a header indicating information on the number of the plurality of start addresses included in the address array.

The transmitting of data may include transmitting data read from a first data storage region related to a first start address among the plurality of start addresses to the host, while preparing to transmit data stored in a second data storage region related to a second start address which is directly adjacent to the first start address in the address array.

The memory card may be an embedded a Multi-Media Card (eMMC) or a Secure Digital (SD) card.

In another embodiment of the inventive concepts, a data processing method of a memory card includes receiving an address array which is output from a host and includes a plurality of start addresses respectively indicating start locations of a plurality of data storage regions; and receiving each of a plurality of data output from the host successively, and programming each of the plurality of received data in respective ones of the plurality of storage corresponding to the plurality of start addresses.

The address array may include a header indicating information on the number of the plurality of start addresses included in the address array.

The programming of each of the plurality of received data may include programming a first data among the plurality of data in a first data storage region related to a first start address, while receiving a second data which is to be stored in a second data storage region related to a second start address which is directly adjacent to the first start address in the address array.

According to an embodiment, the data processing method of the memory card may further include performing an error correction code (ECC) encoding operation on each of a plurality of received data.

According to another embodiment, the data processing method of the memory card may further include storing the received second data in a volatile memory before programming the second data in the second data storage region.

According to a further embodiment, the programming of each of the plurality of received data includes programming a first data among the plurality of data in a first data storage region related to a first start address, and immediately thereafter programming a second data in a second data storage region related to a second start address which is directly adjacent to the first start address in the address array.

The memory card may be an embedded Multi Media Card (eMMC) or a Secure Digital (SD) card.

According to another embodiment, the programming of each of the plurality of received data includes programming each of the received data in a corresponding data storage region among the plurality of data storage regions as soon as each of the plurality of data is received.

According to still another embodiment, the programming of each of the plurality of received data includes receiving and storing the plurality of data; and programming each of the plurality of stored data in each of the plurality of data storage regions successively.

According to still another embodiment, the programming of each of the plurality of received data includes receiving and storing the plurality of data; and programming each of the plurality of stored data in each of the plurality of data storage regions at the same time. The size of each of the plurality of data may be 4 kilobytes.

BRIEF DESCRIPTION OF THE DRAWINGS

These and/or other objects and features of the inventive concepts will become apparent and more readily appreciated from the following description, taken in conjunction with the accompanying drawings, wherein.

DETAILED DESCRIPTION OF THE PREFERRED EMBODIMENTS

JEDEC standard JESD84-A441 is referred to as a reference for a data storage device of the inventive concepts described, e.g., a Multi Media Card (MMC) or an embedded Multi Media Card (eMMC), and SD specifications Part 1 Physical Layer Simplified Specification Version 3.01 on May 18, 2010 of http://www.sdcardorg is referred to as a reference for a Secure Digital (SD) card.

Figure 1:
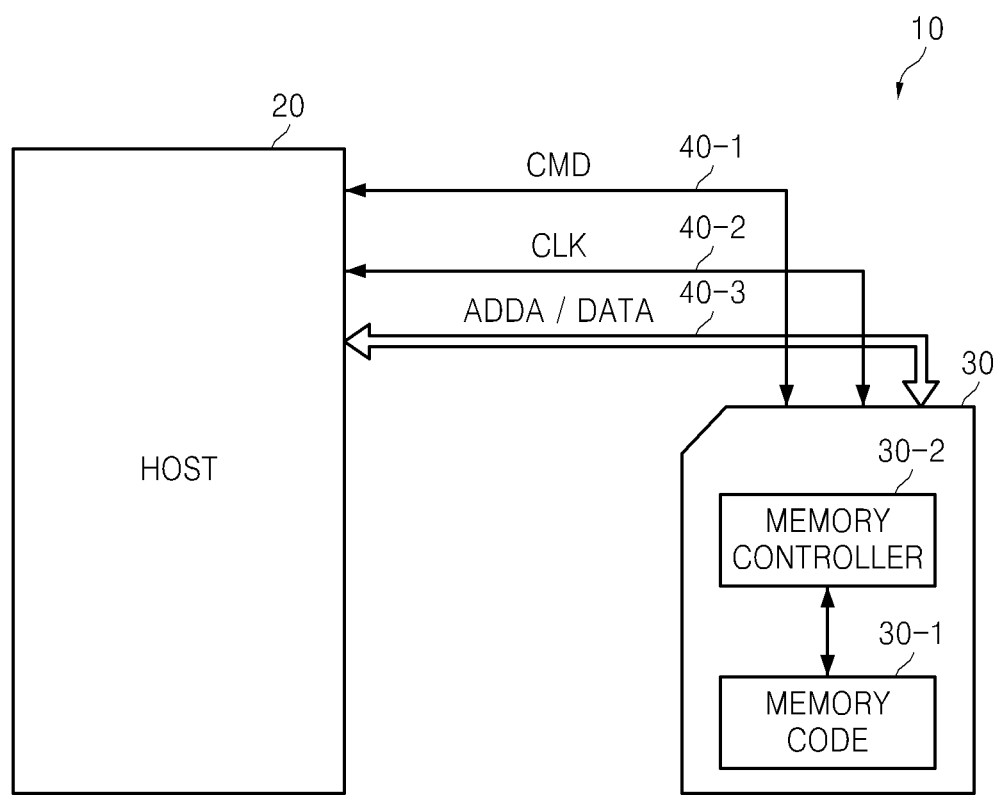
FIG. 1 is a block diagram of a data processing system according to an embodiment of the inventive concepts.
Figure 3:
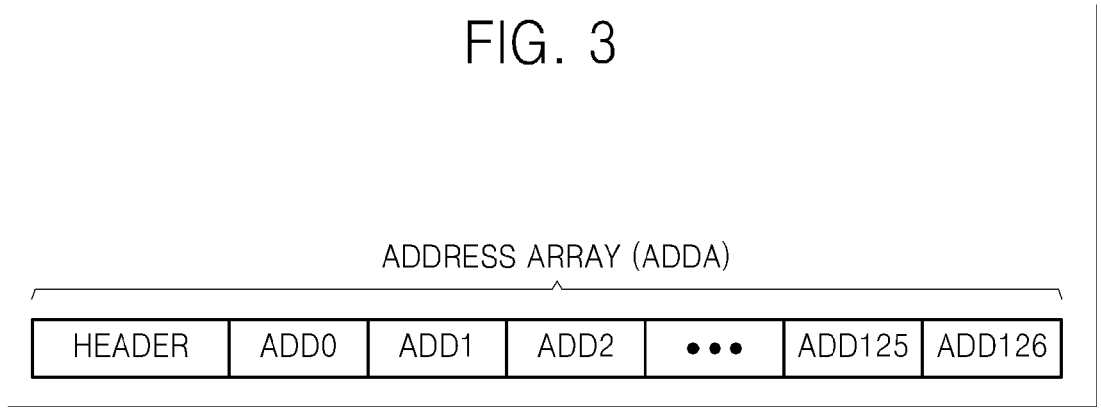
FIG. 3 shows an address array output from a host illustrated in FIG. 1.
Figure 4:
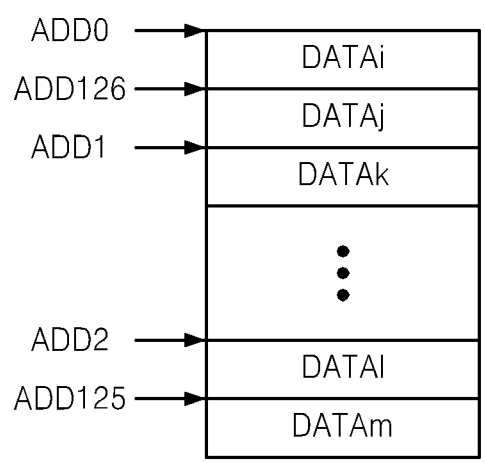
FIG. 4 shows a memory map of a data storage device illustrated in FIG. 1.

FIG. 1 is a block diagram of a data processing system according to an embodiment of the inventive concepts, FIG. 3 is an address array ADDA output from a host illustrated in FIG. 1, and FIG. 4 is a memory map of a data storage device illustrated in FIG. 1.

Referring to FIG. 1, a data processing system 10 includes a host 20 and a data storage device 30. The data storage device 30 may be embodied in an eMMC or a SD card.

The host 20 may generate an address array ADDA to perform a data processing operation, e.g., a random read operation or a random write operation, and transmit a generated address array ADDA to the data storage device 30 through a data bus or data channels 40-3.

The address array ADDA used in the inventive concepts is a collection or a set of addresses ADD0 to ADD126 as illustrated in FIG. 3. The address array ADDA may further include a header HEADER indicating information on how many addresses are included in the address array ADDA.

For convenience of explanation, a header HEADER composed of 4 bytes and an address array ADDA including 127 addresses ADD0 to ADD126 each composed of 4 bytes are illustrated in FIG. 3. Accordingly, the address array ADDA is composed of 512 bytes. Each of the addresses ADD0 to ADD126 may be called an entry.

As illustrated in FIG. 4, each of the addresses ADD0 to ADD126 is a start address indicating a start location of each data storage region where each data is stored. Each data size or volume may be a data size or volume which may be processed by the host all at once, e.g., 4 Kbytes. Each data may be stored randomly in a memory core of the data storage device 30.

As illustrated in FIG. 4, an address ADD0 is a start address indicating a start location of a data storage region where a data DATAi is stored, an address ADD126 is a start address indicating a start location of a data storage region where a data DATAj is stored, and an address ADD125 is a start address indicating a start location of a data storage region where a data DATAm is stored. Accordingly, once the address ADD0 is input to the data storage device 30, the 4 Kbyte data DATAi is output to the host 20 successively.

Figure 2A:
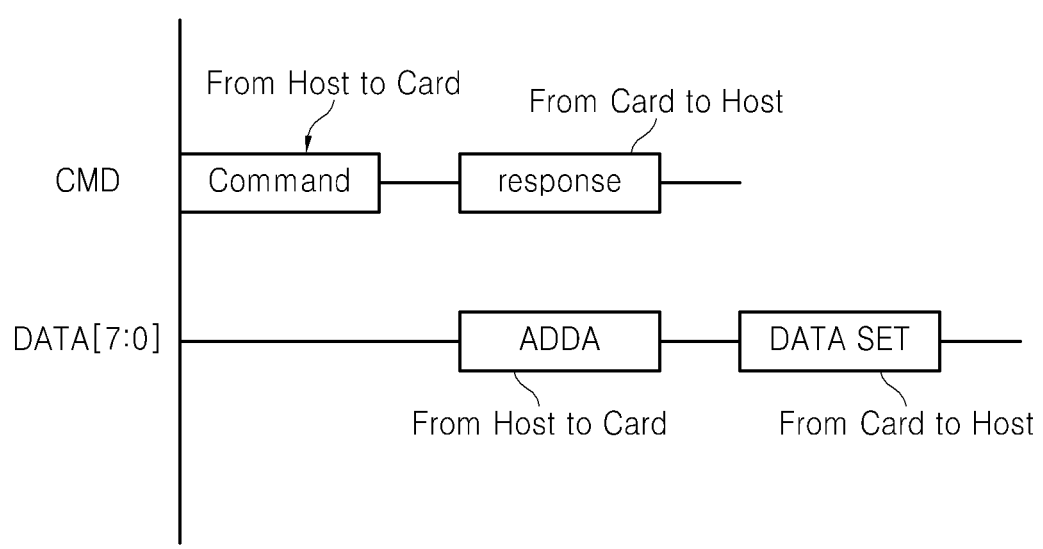
FIG. 2A is a timing diagram for explaining a read operation of the data processing system illustrated in FIG. 1.

FIG. 2A is a timing diagram for explaining a read operation of the data processing system illustrated in FIG. 1. Referring to FIGS. 1, 2A, 3 and 4, a random read operation of the data processing system 10 is explained as follows.

The host 20 outputs a command CMD for performing a random read operation to the data storage device 30 through a bidirectional command bus or a bidirectional command channel 40-1. Here, the host 20 outputs a clock signal CLK to the data storage device 30 through a clock bus or a clock channel 40-2.

A memory controller 30-2 of the data storage device 30 transmits a response to the host 20 through the bidirectional command bus 40-1 in response to the command CMD.

The host 20 receives the response and transmits an address array ADDA including a header HEADER and each start address ADD0, ADD1, ADD2, . . . , ADD125 and ADD126 for a random read operation as illustrated in FIG. 3 to the data storage device 30 through a data bus 40-3 according to a clock signal CLK.

Figure 2B:
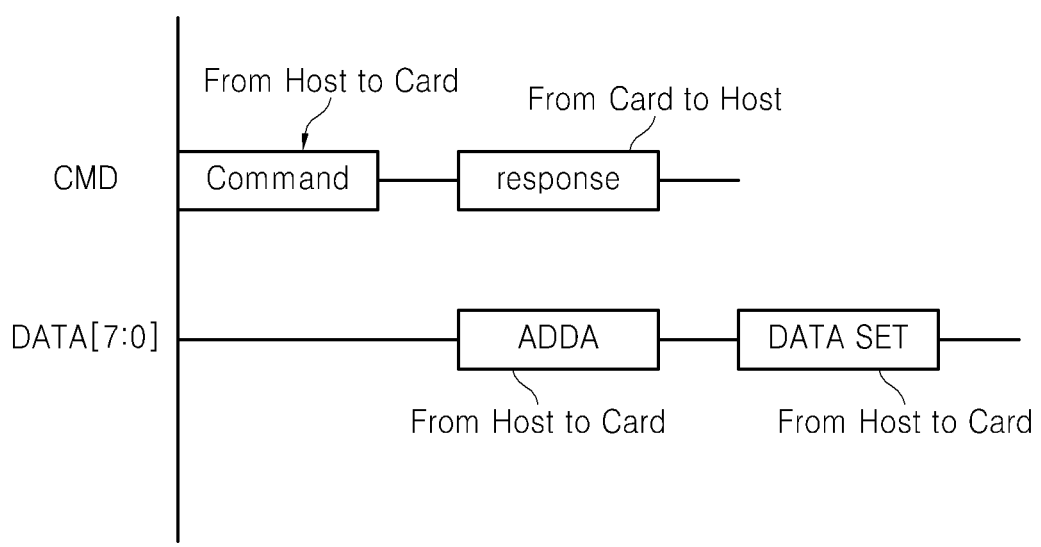
FIG. 2B is a timing diagram for explaining a write operation of the data processing system illustrated in FIG. 1.

For convenience of explanation, FIGS. 2A and 2B illustrate an example embodiment for an 8-bit width data bus (DATA[7:0]; 40-3). However, in accordance with other example embodiments, DATA[0], DATA[3:0] or DATA[7:0] among the 8-bit width data bus(DATA[7:0]; 40-3) may be used to transmit data.

The memory controller 30-2 of the data storage device 30, by translating or decoding an address array ADDA, reads each data which is designated by each address ADD0 to ADD126 included in the address array ADDA and stored in each data storage region of a memory core 30-1, and outputs each read data to the host 20 through the data bus 40-3 successively according to a clock signal CLK.

A data set DATA SET illustrated in FIG. 2A is a collection of each data transmitted to the host 20 successively according to a translation result of each address ADD0 to ADD126.

For example, each data included in a data set DATA SET, i.e., each data DATAi, DATAk, DATAl, . . . , DATAm and DATAj read according to a translation result of each start address ADD0, ADD1, ADD2, . . . , ADD125 and ADD126, is transmitted to the host 20 through the data bus 40-3 successively. Here, once a stop command is input from the host 20 while a corresponding data is being transmitted to the host 20, the data storage device 30 may only transmit the corresponding data in transmission and then stop a read operation.

FIG. 1 shows the memory controller 30-2 as an example of a main subject translating an address array ADDA; however, the address array ADDA may be translated by firmware, and the firmware may be stored inside the memory controller 30-2 or performed by the memory controller 30-2 after being stored in a separate memory.

When the data storage device 30 outputs a data set DATA SET to the host 20 according to a received address array ADDA, it may read data which should be read continuously in advance. Accordingly, a random read time for a random read operation of the data processing system 10 may be reduced. Such an effect will be explained in detail referring to FIGS. 5 and 6.

FIG. 2B is a timing diagram for explaining a write operation of the data processing system illustrated in FIG. 1. Referring to FIGS. 1, 2B, 3 and 4, a random write operation of the data processing system 10 is explained as follows.

The host 20 outputs a command for performing a random write operation to the data storage device 30 through the bidirectional command bus 40-1. Here, the host 20 outputs a clock signal to the data storage device 30 through the clock bus 40-2.

The memory controller 30-2 of the data storage device 30 transmits a response to the host 20 through the bidirectional command bus 40-1 in response to a write command.

The host 20 receives the response and transmits an address array ADDA including a header and each start address ADD0, ADD1, ADD2, . . . , ADD125 and ADD126 for a random write operation as illustrated in FIG. 3 to the data storage device 30 through the data bus 40-3 according to a clock signal CLK.

As illustrated in FIG. 2B, the host 20 transmits each data DATAi, DATAk, DATAl, . . . , DATAm and DATAj included in a data set DATA SET to the data storage device 30 through the data bus 40-3 successively according to a clock signal CLK. A memory core 30-1 of the data storage device 30 stores each data DATAi, DATAk, DATAl, . . . , DATAm and DATAj in each data storage region, which is designated according to each start address ADD0, ADD1, ADD2, . . . , ADD125 and ADD126, according to a control of the memory controller 30-2, successively.

The data storage device 30 receives a data set DATA SET after receiving an address array ADDA. Accordingly, data storage device 30 does not need to receive a write command and an address whenever performing a write operation as in conventional technology, and does not need to wait until an operation according to a previous write command is finished. In addition, data storage device 30 may collect 4 Kbytes of random write data and write the data all at the same time. Accordingly, a random write time for a random write operation of the data processing system 10 may be reduced. Such an effect will be explained in detail referring to FIGS. 7 and 8.

Figure 5:
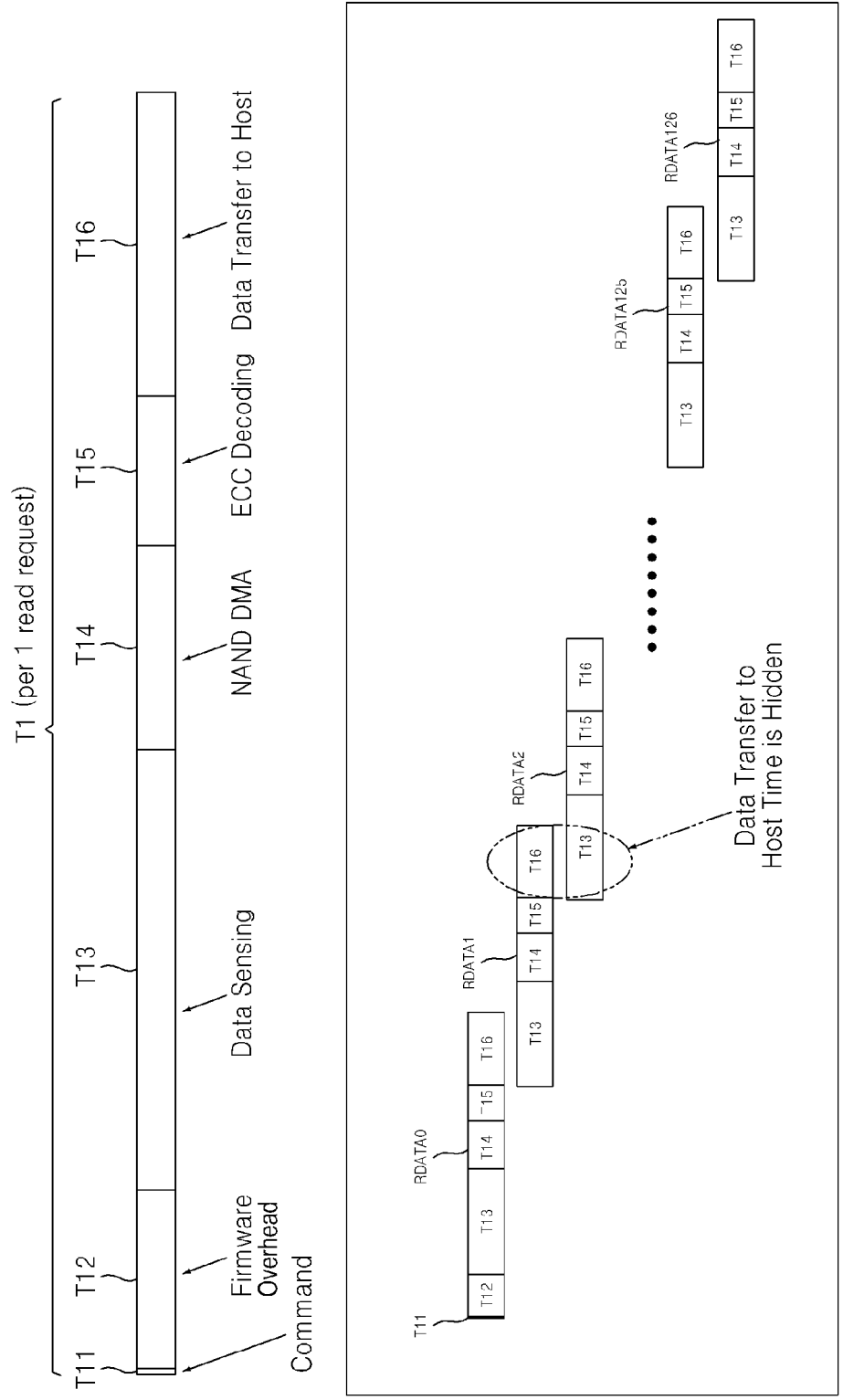
FIG. 5 is an example embodiment of a timing diagram for explaining read performance of the data processing system illustrated in FIG. 1.

FIG. 5 is an example embodiment of a timing diagram for explaining read performance of the data processing system illustrated in FIG. 1. FIG. 5 shows a random write operation timing of the data storage device 30 which has a one channel-one way structure.

Referring to FIG. 5, T1 is time taken to read data, e.g., 4 Kbyte data, from the memory core 30-1 of the data storage device 30 and transmit the data to the host 20 per a read command, e.g., a read request, as shown in equation 1.

$$T1=T11+T12+T13+T14+T15+T16 \quad \text{[Equation 1]}$$

Here, T11 is time taken to receive a read command, T12 is time taken for the memory controller 30-2 or firmware to translate a read command, T13 is time taken to sense-amplify data stored in the memory core 30-1, T14 is time taken to store or move sense-amplified data in a memory, e.g., an SRAM, T15 is time taken to perform ECC decoding on read data, and T16 is time taken to transmit ECC decoded read data to the host 20.

Here, random Input/Output Per Second (rIOPS=1/T1) is calculated by using a reciprocal number of T1.

Referring to FIGS. 1, 2A, 3, 4 and 5, the host 20 transmits an address array ADDA including each start address ADD0, ADD1, ADD2, . . . , ADD125 and ADD126 to the data storage device 30 through the data bus 40-3 in response to a response to perform a random read operation.

The data storage device 30 performs an operation of sense-amplifying data (DATAk=RDATA1) stored in a data storage region designated by a start address ADD1 while transmitting read data (DATAi=RDATA0) read according to a start address ADD0 to the host 20.

Moreover, the data storage device 30 performs an operation of sense-amplifying data DATA1 stored in a data storage region designated by a start address ADD2 while transmitting a sense-amplified read data RDATAk to the host 20 as a read data RDATA1.

In the same manner, the data storage device 30 performs an operation of sense-amplifying data DATAj stored in a data storage region designated by a start address ADD126 while transmitting a sense-amplified read data RDATAm to the host 20 as a read data RDATA125.

As illustrated in FIG. 5, T16 (data transfer to host) for a previous read data and T13 (sense amplifying) for a current read data are overlapped, so that a random read time is dramatically decreased.

That is, rIOPS when a random read operation is performed in the manner as shown in FIG. 5 using an address array ADDA including each start address ADD0, ADD1, ADD2, . . . , ADD125 and ADD126 increases significantly more than rIOPS when a random read operation on 4 Kbyte data is performed 127 times, respectively.

Figure 6:
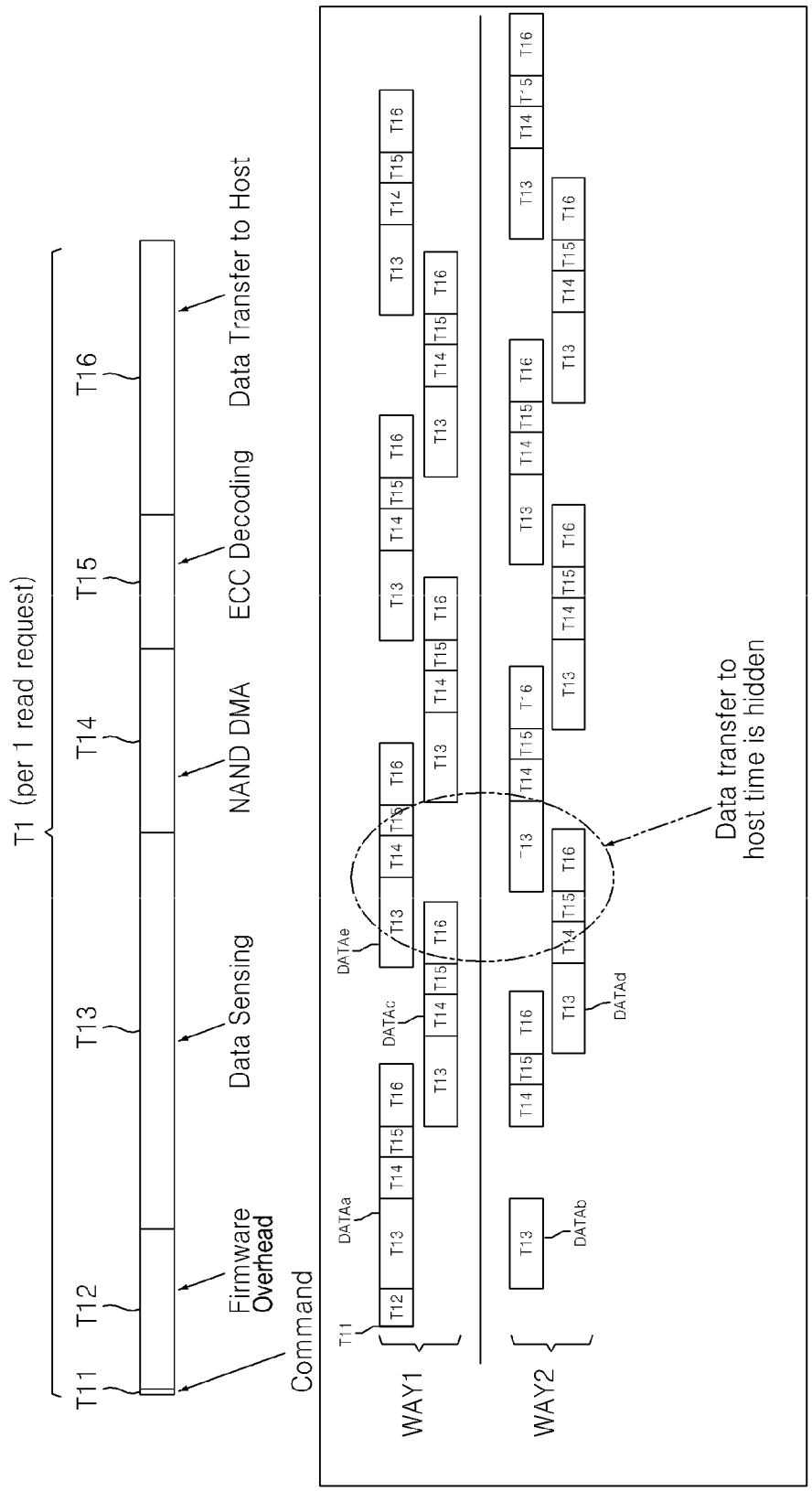
FIG. 6 is another example embodiment of the timing diagram for explaining read performance of the data processing system illustrated in FIG. 1.

FIG. 6 is another example embodiment of the timing diagram for explaining read performance of the data processing system illustrated in FIG. 1. FIG. 6 shows a random read operation timing of the data storage device 30 having a one channel-two way and 100% way distribution structure.

Referring to FIGS. 1, 2A, 3, 4 and 6, the host 20 transmits an address array ADDA including each start address ADD0, ADD1, ADD2, . . . , ADD125 and ADD126 to the data storage device 30 through the data bus 40-3 in response to a response to perform a random read operation.

For example, an operation of sense-amplifying a read data RDATAc is performed while a read data RDATAa is transmitted to the host 20 in a first way WAY1, and an operation of sense-amplifying a read data RDATAe is performed while a read data RDATAc is transmitted to the host 20. In addition, as soon as a read data RDATAc is transmitted to the host 20 while a read data RDATAd is stored or moved in an SRAM in a second way WAY2, an operation of sense-amplifying a read data RDATAe is performed.

Accordingly, a random read operation is performed in both the first way WAY1 and the second way WAY2 of the data storage device 30, so that rIOPS is further increased.

Figure 7:
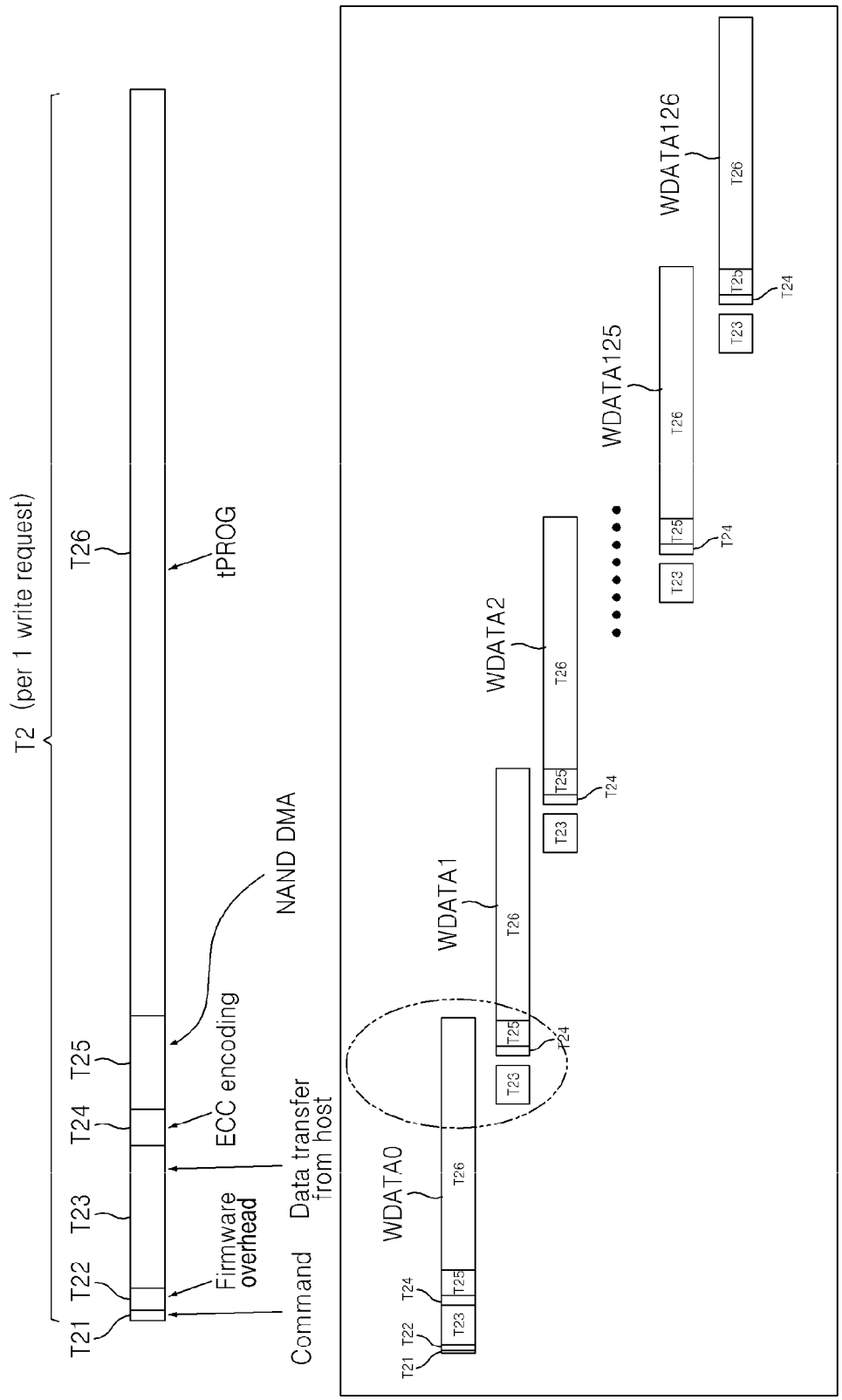
FIG. 7 is an example embodiment of a timing diagram for explaining write performance of the data processing system illustrated in FIG. 1.

FIG. 7 is an example embodiment of a timing diagram for explaining write performance of the data processing system illustrated in FIG. 1. FIG. 7 depicts a write operation timing of the data storage device 30 having a one channel-one way structure.

Referring to FIG. 7, T2 is time taken until a write data, e.g., 4 Kbyte data, output from the host 20 is written or programmed in the memory core 30-1 according to a control of the memory controller 30-2 per a write command, e.g., a write request, as shown in equation 2.

$$T2=T21+T22+T23+T24+T25+T26 \quad \text{[Equation 2]}$$

Here, T21 is a time taken to receive a write command, T22 is time taken for the memory controller 30-2 or firmware to translate the write command, T23 is time taken to receive a write data from the host 20, T24 is time taken for an error-correction code(ECC) encoding, T25 is time taken to store or move an ECC encoded write data in a memory, e.g., an SRAM, and T26 is time taken to program a write data output from the memory in a memory core 30-1.

Here, write Input/Output Per Second (wIOPS=1/T2) is calculated by using a reciprocal number of T2.

Referring to FIGS. 1, 2B, 3, 4 and 7, the host 20 transmits an address array ADDA including a header HEADER and each start address ADD0, ADD1, ADD2, . . . , ADD125 and ADD126 as illustrated in FIG. 3 to the data storage device 30 through the data bus 40-3 after receiving a response to perform a random write operation.

Then, the host 20 transmits each write data WDATA0 to WDATA126 included in a data set DATA SET successively to the data storage device 30 through the data bus 40-3.

Accordingly, a memory core 30-1 is designated according to a start address ADD0 and programs a write data (WDATA0=DATAi) in a data storage region at a proper location determined internally according to a control of a memory controller 30-2.

While a program operation on a write data WDATA0 is performed, the data storage device 30 receives a write data(WDATA1=DATAk), which is output from the host 20 and programmed in a data storage region designed by a start address ADD1, and performs an ECC encoding operation on a received write data WDATA1 and an operation of storing the received write data WDATA1 in a memory, e.g., an SRAM.

The memory core 30-1 programs a write data WDATA1 in a data storage region designated according to a start address ADD1 right after a program operation on a write data WDATA0 is completed.

While a program operation on the write data WDATA1 is performed, the data storage device 30 receives a write data (WDATA2=DATA1), which is output from the host 20 and is to be programmed in a data storage region designated by a start address ADD2, and performs an ECC encoding operation on a received write data WDATA2 and an operation of storing the received write data WDATA2 in a memory, e.g., an SRAM, successively.

In addition, while a program operation on a write data (WDATA125=DATAm) is performed, the data storage device 30 receives a write data WDATA126, which is output from the host 20 and is to be programmed in a data storage region designated by a start address ADD126, and performs an ECC encoding operation on a received write data WDATA126 and an operation of storing the received write data WDATA126 in a memory, e.g., an SRAM, successively.

Then, the data storage device 30 programs the write data WDATA126 in a data storage region designated inside the data storage device 30 by a start address ADD126. It is exemplified in the inventive concepts that the data storage device 30 writes a write data in the memory core 30-1 right after receiving the write data, but the data storage device 30 may gather or collect each write data and write them in the memory core 30-1 at the same time.

The data storage device 30 according to an embodiment of the inventive concepts receives a current write data during performing a program operation on a previous write data even when processing a random write or a random write command, performs an ECC encoding, and programs the current write data in a memory. That is, T23, T24 and T25 on the current write data are hidden by T26 on a previous data.

Figure 8:
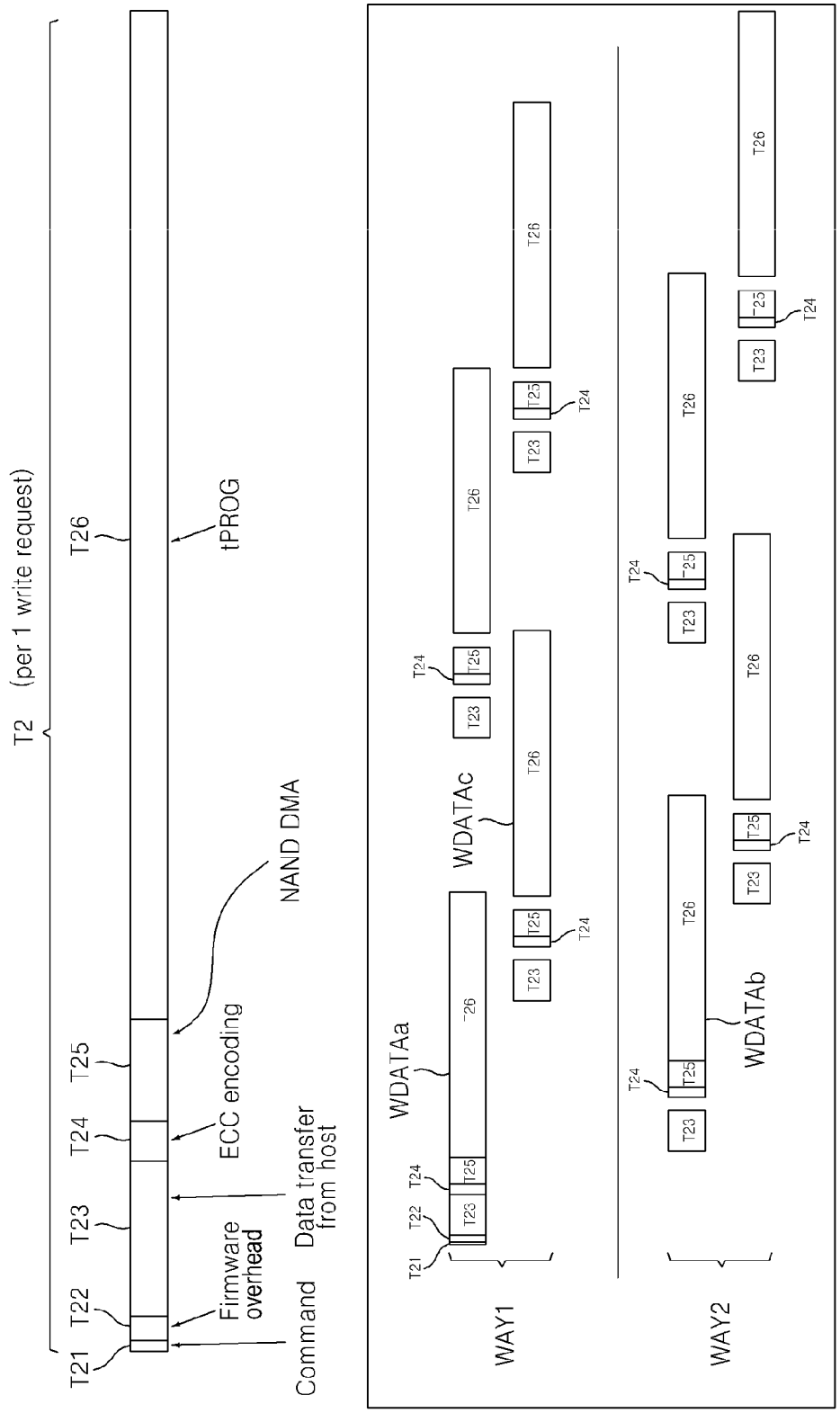
FIG. 8 is another example embodiment of the timing diagram for explaining write performance of the data processing system illustrated in FIG. 1.

FIG. 8 is another example embodiment of the timing diagram for explaining write performance of the data processing system illustrated in FIG. 1. FIG. 8 shows a random write operation timing of the data storage device 30 having one channel and two ways.

Referring to FIGS. 1, 2B, 3, 4 and 8, the host 20 transmits an address array ADDA including a header HEADER and each start address ADD0, ADD1, ADD2, . . . , ADD125 and ADD126 as illustrated in FIG. 3 to the data storage device 30 through the data bus 40-3 after receiving a response to perform a random write operation.

Then, the host 20 transmits each write data WDATAa, WDATAb, WDATAc, . . . included in a data set DATA SET to the data storage device 30 through the data bus 40-3 successively.

Accordingly, the memory controller 30-2 programs a write data WDATAa=DATAi in a data storage region in a first way WAY1 of the memory core 30-1, which is designated by a start address ADD0.

While a program operation on the write data WDATAa is performed, the memory controller 30-2 receives a write data WDATAb to be programmed in a data storage region in a second way WAY2 of the memory core 30-1, which is designated by a start address ADD1, performs ECC encoding on a received write data WDATAb and stores it in a memory e.g., an SRAM.

In addition, while a program operation on the write data WDATAa is performed, the memory controller 30-2 receives a write data WDATAc to be programmed in a data storage region in a first way WAY1 of the memory core 30-1, which is designated by a start address ADD2, performs ECC encoding on a received write data WDATAc and stores it in a memory e.g., an SRAM.

That is, the data storage device 30 of the inventive concepts may receive successively write data WDATAb and WDATAc programmed in each of two ways WAY1 and WAY2 during T26 of a program operation performed in one WAY1 of the two ways WAY1 and WAY2 after receiving an address array ADDA.

Accordingly, write Input/Output Per Second (wIOPS) is further increased.

Technical concepts of the present invention may be applied to multi-channels and/or multi-ways, and accordingly, rIOPS or wIOPS of a data processing device or a data storage device may be considerably increased. Subsequently, a random read time and/or a random write time of the data processing device or the data storage device may be greatly improved.

A random read operation or a random write operation is performed until a stop command is input or 4 Kbyte of a read operation or a write operation as many as an addresses number designated in a header HEADER is completed.

In case of a random write operation, the data storage device 30 stores each data, which is received until the stop command is received, in the memory core 30-1 and transmits a response to the host 20.

A data processing method of a memory card, which may process data by using an address array according to an embodiment of the inventive concepts, may increase considerably a random read frequency per second or a random write frequency per second.

Accordingly, a random read time and/or a random write time of a data storage device performing the method or a data processing system including the data storage device may be greatly reduced.

Although a few embodiments of the inventive concepts have been shown and described, it will be appreciated by those skilled in the art that changes may be made in these embodiments without departing from the principles and spirit of the inventive concepts, the scope of which is defined in the appended claims and their equivalents.

What is claimed is:

1. A data processing method of a data storage device, the method comprising:

receiving a command for performing a random read operation from a host via a command bus, and then communicating a response to the host via the command bus in response to the command; and then, receiving an address array output from the host via a data bus and in accordance with a clock signal communicated from the host, wherein the address array includes a plurality of start addresses indicating start locations of a plurality of data storage regions in the data storage device; and successively transmitting data read from each of the plurality of data storage regions related to each of the plurality of start addresses to the host via the data bus after receiving the address array, wherein the address array comprises the plurality of start addresses received at a same time and does not include the command, wherein when a stop command is received from the host while a corresponding data is being transmitted to the host, the data storage device only transmits the corresponding data and then stops a read operation, and wherein the address array comprises a header including information indicating a number of the plurality of start addresses included in the address array.

2. The method of claim 1, wherein the transmitting of the data read from each of the plurality of data storage regions comprises:
  transmitting data read from a first data storage region related to a first start address among the plurality of start addresses to the host via the data bus, while preparing to transmit data stored in a second data storage region related to a second start address among the plurality of start addresses, wherein the second start address is directly adjacent to the first start address in the address array.

3. The method of claim 1, wherein the data storage device is one of an embedded Multi Media Card (eMMC) and a Secure Digital (SD) card.

4. A data processing method of a data storage device comprising:
  receiving a command for performing a random write operation from a host via a command bus, and communicating a response to the host via the command bus in response to the command; and then,
  receiving an address array from the host via a data bus, wherein the address array includes a plurality of start addresses indicating start locations of a plurality of data storage regions in the data storage device;
  successively receiving a plurality of data output from the host via the data bus, after receiving the address array including the plurality of start addresses; and
  programming each one of the plurality of data in a corresponding one of the plurality of storage regions corresponding to a start address among the plurality of start addresses,
  wherein the address array comprises the plurality of start addresses received at a same time and does not include the command,
  wherein the data storage device receives successively a corresponding data to be programmed in each of a first way and a second way during a program operation performed in the first way after receiving the address array, and
  wherein the address array comprises a header including information indicating a number of the plurality of start addresses included in the address array.

5. The method of claim 4, wherein the programming of each one of the plurality of data comprises:
  programming a first data among the plurality of data in a first data storage region related to a first start address, while receiving a second data to be stored in a second data storage region related to a second start address which is directly adjacent to the first start address in the address array.

6. The method of claim 5, further comprising storing the second data in a volatile memory before programming the second data in the second data storage region.

7. The method of claim 4, further comprising:
  performing an error correction code (ECC) encoding operation on each of the plurality of data.

8. The method of claim 4, wherein programming of each one of the plurality of data comprises:
  programming a first data among the plurality of data in a first data storage region related to a first start address, and immediately thereafter programming a second data in a second data storage region related to a second start address which is directly adjacent to the first start address in the address array.

9. The method of claim 4, wherein the data storage device is one of an embedded Multi Media Card (eMMC) and a Secure Digital (SD) card.

10. The method of claim 4, wherein the programming of each one of the plurality of data comprises:
  programming each one of the plurality of data in a corresponding data storage region among the plurality of data storage regions as soon as each one of the plurality of data is received.

11. The method of claim 4, wherein the programming of each one of the plurality of data comprises:
  receiving and storing the plurality of data in the data storage device; and then,
  successively programming each one of the plurality of data in a one of the plurality of data storage regions.

12. A data processing method of a data storage device comprising:
  receiving a command for performing a random write operation from a host via a command bus, and communicating a response to the host via the command bus in response to the command; and then,
  receiving an address array from the host via a data bus, wherein the address array includes a plurality of start addresses indicating start locations of a plurality of data storage regions in the data storage device;
  successively receiving a plurality of data output from the host via the data bus after receiving the address array; and
  programming each one of the plurality of data in a corresponding one of the plurality of storage regions corresponding to a start address among the plurality of start addresses,
  wherein the programming of each one of the plurality of received data comprises
    receiving and storing the plurality of data in the data storage device; and then,
    simultaneously programming each one of the plurality of data in corresponding ones of the plurality of data storage regions, and
  wherein the address array comprises the plurality of start addresses received at a same time and does not include the command, and
  wherein the address array comprises a header including information indicating a number of the plurality of start addresses included in the address array.

13. A data processing method used in a data processing system including a host connected to one of an embedded Multi Media card (eMMC) data storage device and a Secure Digital (SD) card (hereafter, "data storage device") via a command channel, a clock channel, and a data bus, the method comprising:
  communicating a clock signal from the host to the data storage device, wherein the data storage device performs a write operation in response to the clock signal;
  communicating a write command from the host to the data storage device via the command channel indicating the write operation directed to a set of data entries to be randomly stored in the data storage device;
  generating in the host an address array including a set of addresses, wherein each address in the set of addresses is a start address for a data entry in the set of data entries;
  communicating the address array as an uninterrupted block of start addresses from the host to the data storage device via the data bus following the write command; and then,
  sequentially receiving from the host each data entry in the set of data entries in the data storage device; and in response to the write command and the address array, sequentially programming each data entry in the set of data entries in the data storage device, wherein the address array comprises a plurality of the start addresses received at a same time and does not include the write command, wherein the data storage device receives successively a corresponding data entry to be programmed in each of a first way and second way during a program operation performed in the first way after receiving the address array, and wherein the address array comprises a header including information indicating a number of the plurality of start addresses included in the address array.

14. The method of claim 13, wherein header of the address array further indicates a number of data entries in the set of data entries.

15. The method of claim 13, wherein the set of data entries comprises a first data entry to be stored in a first data storage region identified in the data storage device by a first start address among the set of addresses, and a second data entry to be stored in a second data storage region identified in the data storage device by a second start address among the set of addresses, the first start address being randomly defined with respect to the second start address, and the sequentially programming of each data entry in the set of data entries comprises programming the first data entry in the first data storage region while simultaneously receiving at least a portion of the second data entry from the host via the data bus.

16. The method of claim 15, further comprising:

before programming the first data entry in the first data storage region, encoding the first data entry using an error correction code (ECC) operation.

17. The method of claim 16, wherein the data storage device comprises a memory controller, a memory core of nonvolatile memory cells, and a volatile memory, and the method further comprises:

storing the second data entry in the volatile memory while the first data entry is being programmed to the first data storage region.

18. The method of claim 13, wherein the size of each data entry in the set of data entries is 4 kilobytes.

19. A data processing method used in a data processing system including a host connected to one of an embedded Multi Media card (eMMC) data storage device and a Secure Digital (SD) card (hereafter, "data storage device") via a command channel, a clock channel, and a data bus, the method comprising:

communicating a clock signal from the host to the data storage device, wherein the data storage device performs a write operation in response to the clock signal;

communicating a write command from the host to the data storage device via the command channel indicating the write operation directed to a set of data entries to be randomly stored in the data storage device;

generating in the host an address array including a set of addresses, wherein each address in the set of addresses is a start address for a corresponding data entry in the set of data entries;

communicating the address array as an uninterrupted block of start addresses from the host to the data storage device via the data bus following the write command; and then, sequentially receiving each data entry in the set of data entries in the data storage device; and in response to the write command and the address array, programming each data entry in the set of data entries in the data storage device at the same time, wherein the address array comprises a plurality of the start addresses received at a same time and does not include the write command, and wherein the address array comprises a header including information indicating a number of the plurality of start addresses included in the address array.

* * * * *